(12) United States Patent
Mohammadi et al.

(10) Patent No.: US 11,240,600 B1
(45) Date of Patent: Feb. 1, 2022

(54) SENSOR ASSEMBLY AND ELECTRICAL CIRCUIT THEREFOR

(71) Applicant: Knowles Electronics, LLC, Itasca, IL (US)

(72) Inventors: Mohammad Sadegh Mohammadi, Lyngby (DK); Mohammad Shajaan, Copenhagen (DK); Claus Erdmann Furst, Roskilde (DK); Jens Tingleff, Copenhagen (DE); Henrik Thomsen, Holte (DK); Kristian Hansen, Copenhagen (DK)

(73) Assignee: KNOWLES ELECTRONICS, LLC, Itasca, IL (US)

( * ) Notice: Subject to any disclaimer, the term of this patent is extended or adjusted under 35 U.S.C. 154(b) by 0 days.

(21) Appl. No.: 17/096,499

(22) Filed: Nov. 12, 2020

(51) Int. Cl.
| | | |
|---|---|---|
| *H04R 3/02* | (2006.01) | |
| *H03M 3/00* | (2006.01) | |
| *H04R 1/04* | (2006.01) | |
| *H04R 19/04* | (2006.01) | |
| *H04R 29/00* | (2006.01) | |

(52) U.S. Cl.
CPC .............. *H04R 3/02* (2013.01); *H03M 3/354* (2013.01); *H03M 3/464* (2013.01); *H03M 3/496* (2013.01); *H04R 1/04* (2013.01); *H04R 19/04* (2013.01); *H04R 29/004* (2013.01); *H04R 2201/003* (2013.01)

(58) Field of Classification Search
CPC . H04R 3/02; H04R 1/04; H04R 19/04; H04R 29/004; H04R 2201/003; H03M 3/354; H03M 3/464; H03M 3/496
See application file for complete search history.

(56) References Cited

U.S. PATENT DOCUMENTS

| | | |
|---|---|---|
| 7,190,038 B2 | 3/2007 | Dehe et al. |
| 7,473,572 B2 | 1/2009 | Dehe et al. |
| 7,781,249 B2 | 8/2010 | Laming et al. |
| 7,795,695 B2 | 9/2010 | Weigold et al. |
| 7,825,484 B2 | 11/2010 | Martin et al. |
| 7,829,961 B2 | 11/2010 | Hsiao |
| 7,856,804 B2 | 12/2010 | Laming et al. |
| 7,903,831 B2 | 3/2011 | Song |
| 2005/0207605 A1 | 9/2005 | Dehe et al. |
| 2007/0278501 A1 | 12/2007 | Macpherson et al. |
| 2008/0175425 A1 | 7/2008 | Roberts et al. |
| 2008/0267431 A1 | 10/2008 | Leidl et al. |
| 2008/0279407 A1 | 11/2008 | Pahl |
| 2008/0283942 A1 | 11/2008 | Huang et al. |
| 2009/0001553 A1 | 1/2009 | Pahl et al. |

(Continued)

OTHER PUBLICATIONS

U.S. Appl. No. 16/874,503, filed May 14, 2010, Pederson, Michael.

*Primary Examiner* — Mark Fischer
(74) *Attorney, Agent, or Firm* — Foley & Lardner LLP

(57) ABSTRACT

A sensor signal processing circuit including a delta-sigma analog-to-digital converter (ADC) and a control circuit is disclosed. The circuit is configured to adaptively activate one or more segments of current elements for sequential sampling periods based on a digital signal input to a DAC, wherein less than N current elements are allocated to each segment, each current element in an active segment is enabled and either contributes to a feedback signal of the DAC or does not contribute to the feedback signal, and current elements not in an active segment are disabled. The circuit can be integrated with an acoustic or other sensor as part of a sensor assembly.

20 Claims, 4 Drawing Sheets

(56) References Cited

U.S. PATENT DOCUMENTS

| | | |
|---|---|---|
| 2009/0180655 A1 | 7/2009 | Tien et al. |
| 2010/0046780 A1 | 2/2010 | Song |
| 2010/0052082 A1 | 3/2010 | Lee et al. |
| 2010/0128914 A1 | 5/2010 | Khenkin |
| 2010/0183181 A1 | 7/2010 | Wang |
| 2010/0246877 A1 | 9/2010 | Wang et al. |
| 2010/0290644 A1 | 11/2010 | Wu et al. |
| 2010/0322443 A1 | 12/2010 | Wu et al. |
| 2010/0322451 A1 | 12/2010 | Wu et al. |
| 2011/0013787 A1 | 1/2011 | Chang |
| 2011/0075875 A1 | 3/2011 | Wu et al. |
| 2019/0387326 A1 | 12/2019 | Hansen et al. |
| 2020/0010315 A1 | 1/2020 | Tingleff et al. |

SENSOR ASSEMBLY AND ELECTRICAL CIRCUIT THEREFOR

FIELD OF THE DISCLOSURE

The present disclosure relates generally to digital sensors like microphone assemblies, electrical circuits therefor, and methods of operating the same.

BACKGROUND

Power consumption and size are paramount considerations in devices comprising a microphone as part of a voice interface, particularly in battery-operated devices but also in devices connected to a power grid. Such devices include smart speakers, hearing aids and other wearable devices, portable communication and computing devices such as smartphones, mobile phones and tablets among other devices.

Digital microphones and other sensors often comprise a multibit current-mode delta-sigma analog-to-digital converter (ADC) for which a digital-to-analog converter (DAC) is an essential building-block. The input current accommodated by a current-mode ADC is limited by an amount of feedback current supplied to the ADC input by the DAC. High dynamic range generally requires that the DAC provide a high feedback current to the ADC input. Thus the DAC can be a significant source of power consumption.

BRIEF DESCRIPTION OF THE DRAWINGS

The objects, features and advantages of the present disclosure will become more fully apparent to those of ordinary skill in the art upon careful consideration of the following Detailed Description and the appended claims in conjunction with the accompanying drawings described below.

Figure 1:
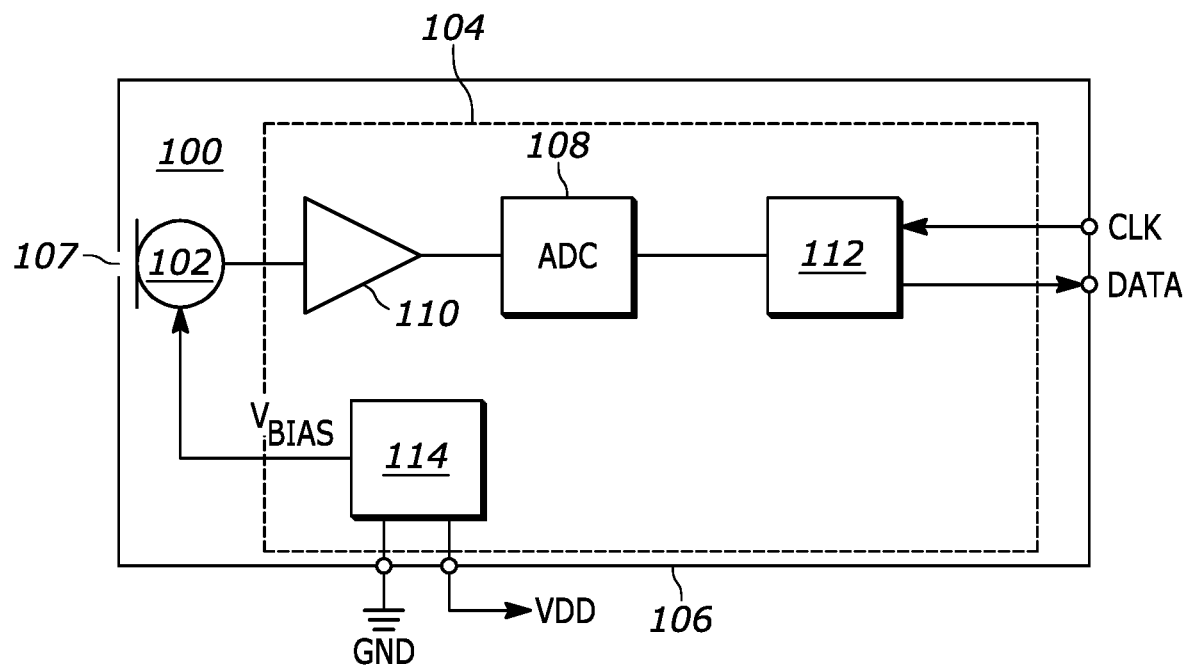
FIG. 1 is a schematic block diagram of a digital sensor assembly.

Those of ordinary skill in the art will appreciate that elements in the drawings are illustrated for simplicity and clarity and may thus be disproportionate or omit elements unnecessary for conveying how to make and use the subject matter disclosed, that acts or steps described or depicted in a particular order may be performed in a different order or sequence absent a contrary indication, and that the terms and expressions herein have the meaning ordinarily accorded to such terms and expressions with respect to their corresponding areas of inquiry and study except where other meanings have otherwise been defined herein.

DETAILED DESCRIPTION

The present disclosure relates to digital sensor assemblies, electrical circuits therefor, and methods of operating the same. The digital sensor assembly generally comprises a sensor (i.e., transduction element) electrically coupled to a sensor signal processing circuit. The sensor can be a capacitive, piezo or optical electro-acoustic transduction element among other known and future sensors configured to convert a sensed environmental condition into a corresponding electrical signal. Such sensors can be fabricated from micro-electromechanical systems (MEMS) or some other known or future technology. In one implementation, the sensor is an acoustic sensor and the electrical circuit is a microphone signal processing circuit. In other implementations, the sensor is a non-acoustic sensor and the electrical circuit is a non-acoustic sensor signal processing circuit. Such other sensors include pressure, temperature, gas, and humidity sensors, among others. FIG. 1 shows a digital sensor assembly 100 comprising a sensor 102 coupled to an electrical circuit 104 described further herein.

In some implementations, the digital sensor assembly comprises a housing including an external-device interface for integration with a host device. The interface can be configured for surface-mounting or for through-hole mounting, among other known or future mounting techniques. The sensor and the electrical circuit can be disposed in the housing and the electrical circuit can be electrically coupled to contacts on the external-device interface. In microphone and other sensor assemblies, the housing can comprise a port by or through which the sensor can detect environmental conditions external to the housing. In a more particular implementation, the housing comprises a cover portion (e.g., a lid fabricated from metal or other material having shielding properties suitable for the particular use case) mounted on a base portion including the external-device interface. Any required port can be located on the base, sidewall or cover portion and the sensor can be mounted over or proximate to the sound port to sense sound or other conditions of interest.

In FIG. 1, the sensor 102 and the electrical circuit 104 are disposed within a housing 106 to form the digital sensor assembly. In some implementations, the housing can comprise a port 107 through which environmental conditions (e.g., sound, pressure, humidity, etc.) outside the housing can be detected by the sensor within the housing. Some acoustic vibration sensor assemblies may not require a port. In other implementations, the digital sensor assembly 100 comprises the sensor 102 and sensor signal processing circuit 104, but these elements are not necessarily disposed in or integrated with the housing 106.

As suggested, the electrical circuit described herein can be implemented as a microphone signal processing circuit for use with an acoustic sensor or as some other sensor signal processing circuit. The electrical circuit generally comprises a multibit delta-sigma analog-to-digital converter (ADC) including a digital-to-analog converter (DAC) having a plurality of N selectably enabled current elements in a feedback path of the ADC. Each current element comprises a current source, a current sink or both current source and current sink. The ADC is configured to generate a digital signal based on the electrical signal received from the sensor. A control circuit coupled to the plurality of current elements is configured to adaptively activate one or more segments of current elements for a sampling period, wherein each active segment comprises less than N current elements, and each current element in the active segment is enabled. Some, none or all of the enabled current elements in an active segment contribute to the DAC feedback signal during the sampling period. Current elements not in an active segment are disabled. Power consumption can thus be reduced without compromising the dynamic range of the electrical circuit.

In FIG. 1, the processing circuit 104 comprises a delta-sigma (IA) analog-to-digital converter (ADC) 108 coupled to the sensor 102 and is configured to produce a multibit digital signal based on the sensor signal. In some implementations, the circuit can optionally include a signal conditioning circuit 110 interconnecting the sensor 102 and the ADC 108. The signal conditioning circuit can include one or more of a buffer-amplifier, a sample-and-hold circuit, a filter among other functional circuits depending on the particular sensor type and the application or use case. For example, in some sensor assemblies, the ADC can be coupled to an interface circuit 112 for conversion of the ADC output to a different signal format like pulse density modulation (PDM) or SoundWire among others. Alternatively, the electrical circuit can output a PCM (e.g., an $I^2S$ format) signal. The interface circuit can be coupled to clock (CLK) and data (DATA) contacts of an external-device interface of the sensor assembly. In implementations including a capacitive sensor, the processing circuit can include a charge pump 114 for applying a bias voltage to the sensor 102. Other sensors, for example, piezo sensors, may not require a bias and thus the charge pump circuit is not required. The sensor assembly can also include other contacts, like voltage supply (VDD) and ground (GND) among others. These and other contacts (e.g., CLK, DATA . . . ) can be part of a common external-device interface of the housing.

Figure 2:
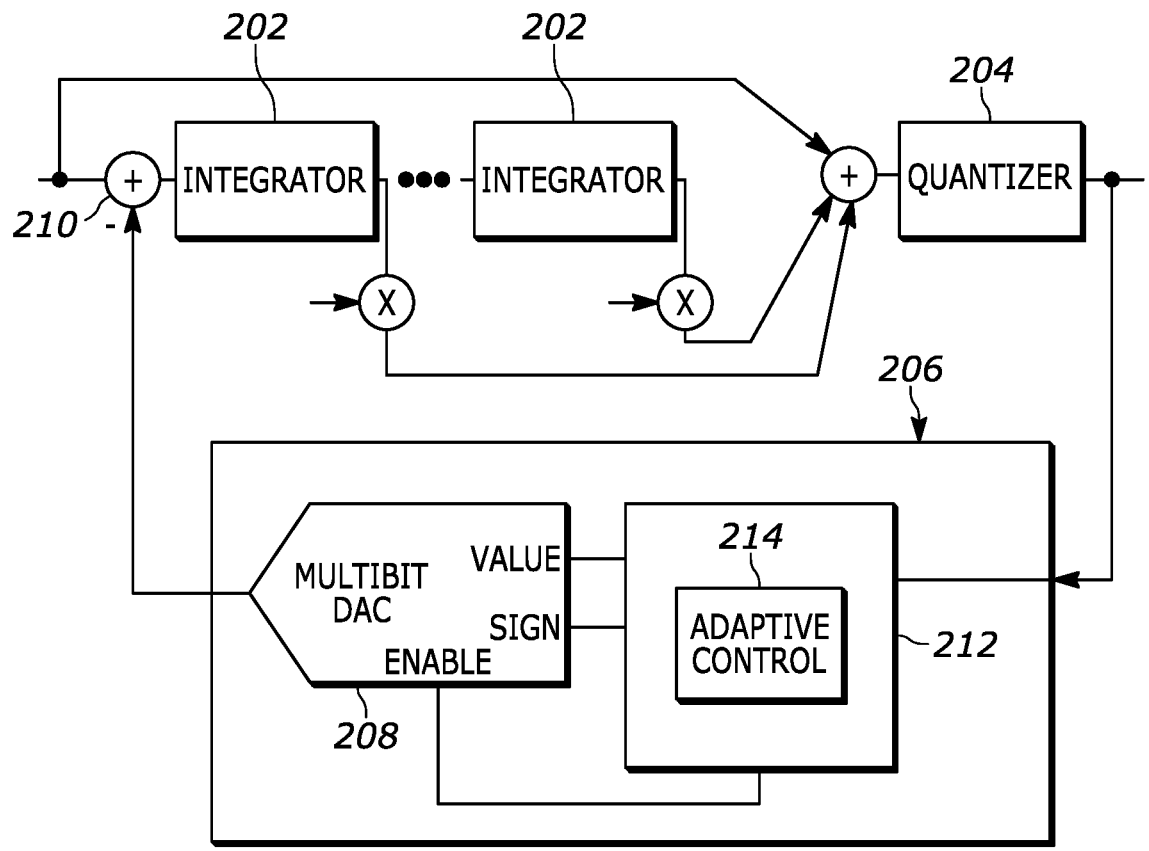
FIG. 2 is a schematic block diagram of a multibit delta-sigma ADC.

In FIG. 2, the ADC comprises a plurality of integrators 202 having outputs coupled to a quantizer 204, and a DAC 206 in a feedback path of the ADC between a digital output of the ADC and an analog input thereof. The DAC comprises a plurality of N current elements 208 and is configured to provide an analog feedback signal that is combined with an analog signal at an input of the ADC at 210. A control circuit 212 coupled to the plurality of current elements is configured to adaptively activate one or more segments of current elements for sequential sampling periods. The adaptive control functionality 214 of the control circuit can be implemented by hardware, firmware, software or combinations thereof. In FIG. 2, the control circuit is shown as part of the feedback path. More generally, however, the control circuit can be separate and apart from the feedback path.

Figure 3:
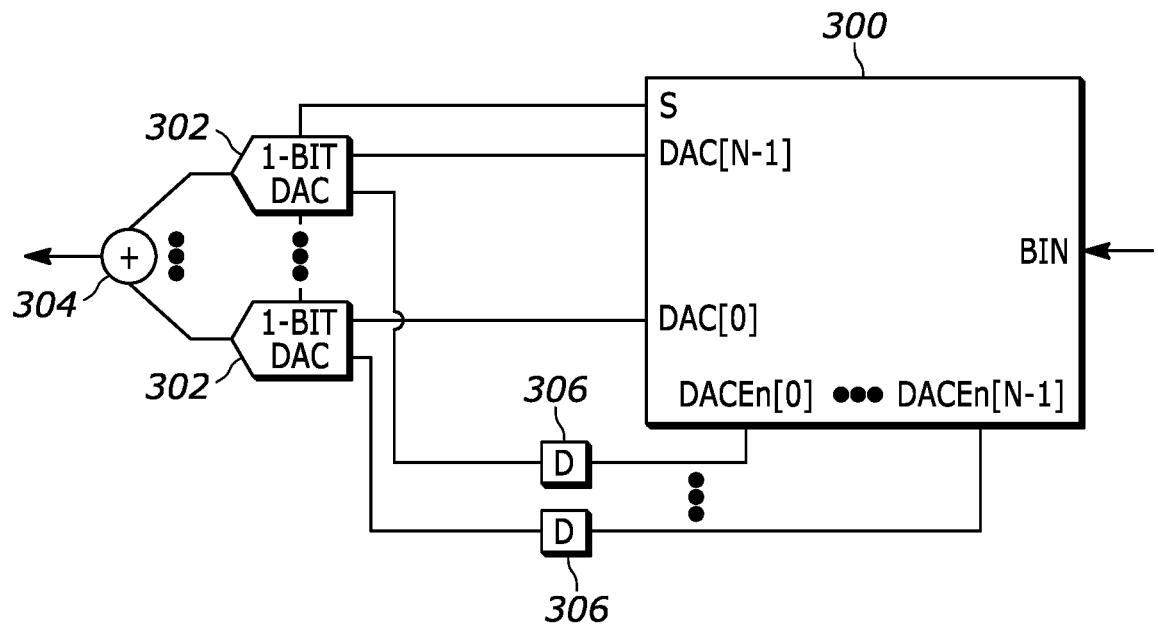
FIG. 3 is a more detailed schematic of a control portion of a digital to analog converter (DAC) portion of the ADC.

In FIG. 3, the control circuit 300 includes a control interface having outputs DAC[i] where i=1-N, sign outputs S, and enable outputs DACEn[i], corresponding to each of a plurality current elements, e.g., 1-bit DAC elements 302. The outputs of the enabled current elements contributing to the feedback signal are combined at 304 before being combined with the analog signal at the input of the ADC, for example, at 210 in FIG. 2.

The number of segments active during a particular sampling period can be based on a magnitude or other characteristics of a digital signal input to the DAC in a prior sampling period. Correlation between the magnitude of the digital signal and the number of enabled current elements required for a particular sampling period. Each active segment is allocated a fixed number of enabled current elements, less than the total number of current elements N. Thus the characteristic of the digital signal can be predictive of the number of active segments required for a particular sampling period. Current elements not allocated to an active segment are disabled. Each enabled current element in an active segment either contributes to the feedback signal or does not contribute to the feedback signal of a particular sampling period depending on the characteristic of the digital signal input to the DAC. In one implementation, for each sampling period, the number of enabled current elements is a multiple of the number of current elements in each active segment and the number of active segments. For example, 10 current elements would be enabled for 2 active segments each having 5 current elements.

Figure 4:
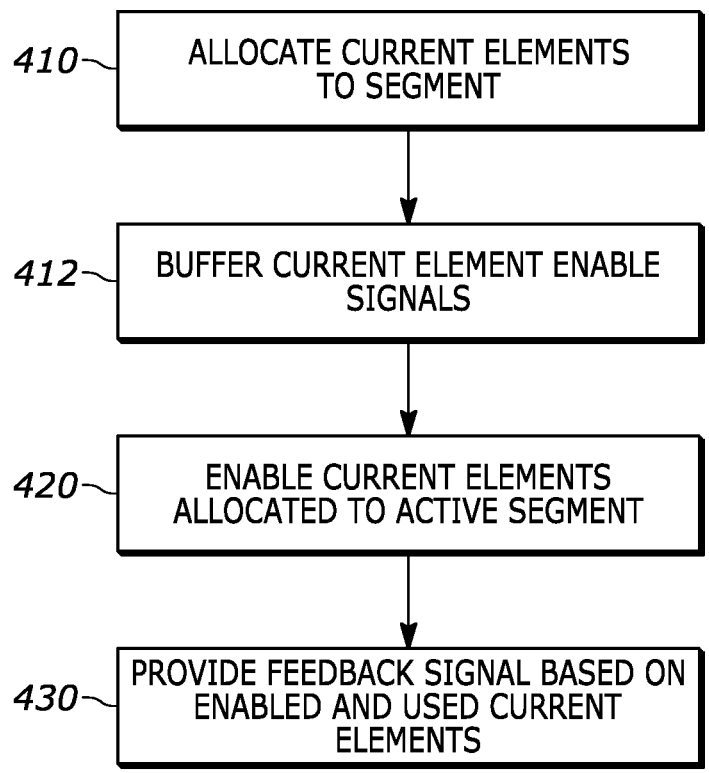
FIG. 4 is a process flow diagram 400 for processing a sensor signal.

FIG. 4 is a process flow diagram 400 for processing a sensor signal in an integrated circuit comprising a multibit current-mode delta-sigma analog-to-digital converter (ADC) comprising a digital-to-analog converter (DAC) having N current elements. The sensor signal can represent sound, vibration, pressure, humidity, temperature, gas concentration, among other conditions and combinations thereof detected by one or more sensors. One or more segments of current elements are adaptively activated for a current sampling period based on a digital signal input to the DAC in a prior sampling period by allocating less than N current elements to the one or more active segments. At 410, current elements are allocated to the one or more segments to be activated for a given sampling period. Current elements previously allocated to an active segment and previously contributing to a feedback signal are not reallocated to another active segment until after all or substantially all N current elements have been allocated to an active segment and contributed to the feedback signal. At 420, the current elements allocated to the active segments are enabled, wherein current elements not allocated to the active segments are disabled. While allocation and enabling are illustrated as occurring sequentially, these acts can occur simultaneously. At 430, a feedback signal based on one or more of the enabled current elements of the active segments is provided to an input of the ADC. The process of FIG. 4 repeats for subsequent sampling periods.

Figure 5:
FIG. 5 illustrates a current element allocation scheme for sequential sampling periods.
Figure 6:
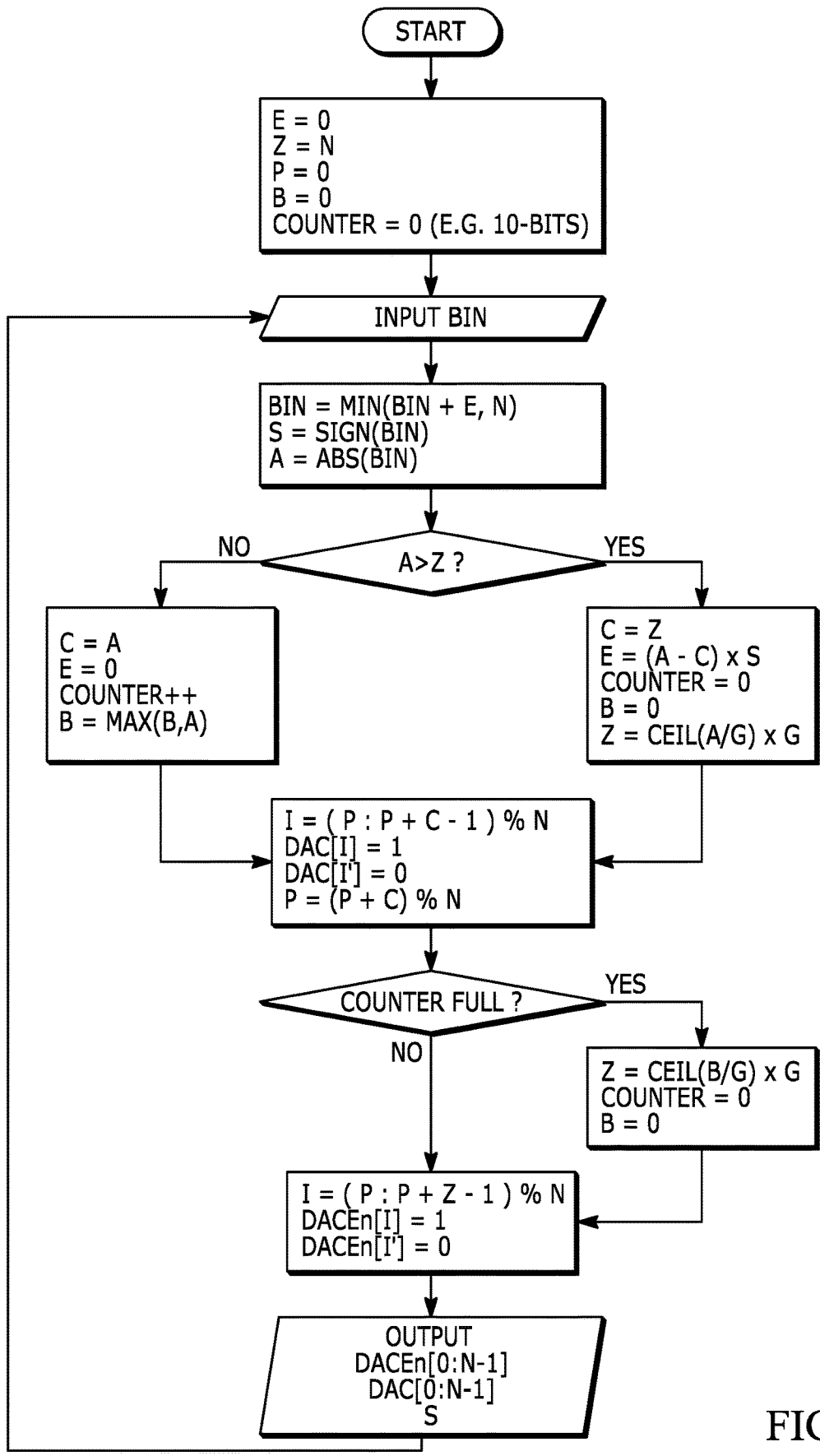
FIG. 6 is a process flow diagram for a non-overlapped sliding allocation algorithm.

FIG. 5 illustrates the activation of segments of current elements by a non-overlapped sliding allocation algorithm for several sequential sampling periods where the total number of DAC current elements is N=24 and each segment is allocated 5 current elements. In other implementations, the total number of current elements N can be more or less than 24 and the number of active current elements allocated to an active segment can be more or less than 5. For the first sampling period, the DAC Input=2 and one segment is activated by allocating and enabling (i.e., turning ON) the allocated current elements, wherein the non-allocated current elements are disabled (i.e., turned OFF). During the second sampling period, only 2 of the enabled current elements contribute to the feedback signal (i.e., are used) and the 3 remaining enabled current elements do not contribute to the feedback signal (i.e., are unused).

In FIG. 5, for the second sampling period, the DAC IINPUT=3 and one segment is activated by allocating and enabling the allocated current elements, wherein the non-allocated current elements are disabled. The segment active during the second sampling period excludes current elements that contributed to the feedback signal during the first sampling period. During the second sampling period, only 3 of the enabled current elements contribute to the feedback signal and the 2 remaining enabled current elements do not contribute to the feedback signal.

In FIG. 5, for the third sampling period, the DAC INPUT=4 and one segment is activated by allocating and enabling the allocated current elements, wherein the non-allocated current elements are disabled. The segment active during the third sampling period excludes current elements that contributed to the feedback signal during the first and second sampling periods. During the third sampling period, only 4 of the 5 enabled current elements contribute to the feedback signal and the 1 remaining enabled current element does not contribute to the feedback signal.

An overflow event occurs when a number of enabled current elements are insufficient to provide the feedback current required during a sampling period. An overflow event may result from a possible, but unlikely, prediction error or other causes. In situations where an overflow event occurs, the control circuit is configured to increase a number of segments activated for a subsequent sampling period in response to the overflow event and to modify the DAC feedback signal of the subsequent sampling period by a deviation value associated with the overflow event. In FIG. 4, the allocation of current elements to the active segment added in response to the overflow event during the prior sampling period, along with the allocation of current elements to the segments activated based on the magnitude of the DAC input signal, occurs at 410. Modification of the DAC feedback signal in response to the overflow event occurs at 430.

In FIG. 5, for the fourth sampling period, the DAC INPUT=6 and one segment is activated by allocating and enabling the allocated current elements, wherein the non-allocated current elements are disabled. The segment active during the third sampling period excludes current elements that contributed to the feedback signal during the first, second and third sampling periods. During the fourth sampling period, all 5 enabled current elements of the active element contribute to the feedback signal. However, the 5 enabled current elements of the single active segment are insufficient to output a value corresponding to the DAC INPUT=6. The result is an "overflow event" that will produce an error value of 1, which can be stored. To compensate, the error value will be added to the DAC input value for the next sampling period. An additional segment is also activated for the next sampling period to ensure there are a sufficient number of enabled current elements for the next input value plus the error value as described herein.

In FIG. 5, for the fifth sampling period, the error value=1 from the overflow event during the prior (fourth) sampling period is added to the DAC Input=2, resulting in a DAC Input=3 for the fifth sampling period. This error compensation produces only minor, if any, audible artifacts where the signal is adequately oversampled and noise shaped. An additional segment is also activated for the fifth sampling period due to the overflow event that occurred in the fourth sampling period, resulting in 10 enabled current elements. The current elements allocated to the segments active during the fifth sampling period exclude current elements that contributed to the feedback signal during the first, second, third and fourth sampling periods. During the fifth sampling period, only 3 of the enabled current elements contribute to the feedback signal and the 7 remaining enabled current elements do not contribute to the feedback signal.

In the non-overlapped sliding allocation scheme described above, the current elements are allocated to active segments sequentially and rotationally. In other allocation schemes however the current elements are allocated rotationally, but not necessarily sequentially. For example, a non-sequential allocation scheme could allocate every other current element to the active segment. The rotational allocation can be performed algorithmically using an index [i] associated with the current elements, DAC[i]. In one implementation, a current element contributing to the feedback signal in a prior sampling period is not reallocated to another segment until all DAC current elements have been allocated to an active segment and have contributed to a feedback signal. A current element contributing to the feedback signal in a prior sampling period is not reallocated to a segment active until after all or substantially all N current elements have been allocated to an active segment and contributed to the feedback signal. As suggested, the allocation and enablement of current elements to active segments can be implemented by hardware, firmware or software integrated in or with the sensor signal processing circuit.

FIG. 5 is a flowchart of an exemplary implementation of a non-overlapped sliding DAC current element allocation algorithm. The number of current elements G in an active segment is less than the total number of current elements N. Small values G increase energy efficiency but some headroom should be provided to avoid instability from overflow events. In the flowchart, DAC[i] corresponds to the ith DAC element and DACEn[i] is the enable signal of the ith current element for the next sampling period. Also "%" represents the mod operation, "ABS( )" is absolute value, "CEIL( )" is ceiling function, "MAX( )" and "MIN( )" are the maximum and minimum functions, "++" is increase by one, and the compliment of a set of indices I is denoted by I'. Other variables: Input Bin=input to multibit current DAC; N=number of current elements; G=segment size; DACEn[0:N−1]=Vector specifying enabled/off state for each current element; DAC[0:N−1]=Vector specifying output value of DAC; S=sign of output value (0/1); A is absolute value of the input; Z maintains the number of current elements that need to be active in the next cycle. It is initiated with the total number of available elements (N); C is the achievable number of current elements that can be allocated for the current input; E is the error between the achievable DAC output and the desired output; Counter counts the number of times (input cycles) in the past that no overflow has occurred; P is the DWA pointer; I is an index set; N is total number of current element; B maintains the largest input within the past "no-overflow" period, to be able to reduce the active set size when counter is full.

In implementations where latency is an issue, the control circuit can be configured to generate and buffer, during a current sampling period, an enable signal that activates one or more segments for a subsequent sampling period. In this case, signals for enabling current elements allocated to one or more segments of the current sampling period would have been generated and buffered during a prior sampling period temporally adjacent to the current sampling period. In FIG. 3, the control circuit includes buffers 306 for this purpose. Such buffers can be implemented in hardware, firmware or software, or a combination thereof integrated in or with the electrical circuit. In FIG. 4, the current element enable signals are buffered at 412 prior to enabling the current elements at 420.

In implementations where mismatch shaping is desired, for example to compensate for DAC error caused by variation among the current elements, the circuit further comprises an executable mismatch shaping algorithm, wherein execution of the mismatch shaping algorithm reduces signal distortion. In one implementation, the mismatch shaping algorithm is a data weighted averaging algorithm. In other implementations other algorithms can be used for this purpose. The efficacy of the mismatch shaping algorithm is largely unaffected by implementation of the current allocation algorithms described herein. As noted herein, overflow events can be compensated with little or no adverse effect on audio quality by oversampling and appropriate noise shaping. Mismatch shaping can be implemented by hardware, firmware or software integrated in or with the sensor signal processing circuit.

In a first implementation, a sensor signal processing circuit comprises a delta-sigma analog-to-digital converter (ADC) configured to generate a digital output signal based on an electrical signal received from a sensor, and a control circuit controllably coupled to N current elements in a digital-to-analog (DAC) feedback path of the ADC, the control circuit configured to adaptively activate one or more segments of current elements for a current sampling period based on a digital signal input to the DAC, wherein each active segment comprises less than N current elements, each current element in the one or more active segments is enabled and either contributes to a feedback signal of the DAC or does not contribute to the feedback signal, and current elements not in the active segment are disabled.

In a variation of the first implementation, current elements contributing to the feedback signal in a prior sampling period are not reallocated to a segment active during a subsequent sampling period until after all or substantially all N current elements have contributed to the feedback signal.

The sensor signal processing circuit of the first implementation and its variations can also comprise a buffer, wherein the control circuit is configured to generate and store in the buffer, during a prior sampling period, an enable signal for enabling current elements allocated to the one or more segments active during the current sampling period.

The control circuit of the first implementation and its variations can be configured to increase a number of segments active during the current sampling period in response to an overflow condition occurring in a prior sampling period and to modify the feedback signal of the current sampling period by a deviation value associated with the overflow condition.

The control circuit of the first implementation at its variations can be configured to allocate current elements to active segments on a rotational basis, wherein current elements contributing to the feedback signal in a prior sampling period are not reallocated to a segment active during the current sampling period until after all N current elements have been allocated to an active segment and contributed to the feedback signal.

The control circuit of the first implementation and its variations can be configured to reduce distortion attributable to the DAC by performing mismatch shaping.

The sensor signal processing circuit of the first implementation and its variations can be combined with a sensor, both of which are disposed in a housing comprising an external-device interface, wherein the ADC is electrically coupled to the sensor and to contacts of the external device interface.

The sensor signal processing circuit of the first implementation and its variations can be combined with an acoustic sensor configured to convert sound into an electrical signal and disposed in a housing, wherein the sensor is acoustically coupled to a sound port of the housing and the ADC is electrically coupled to the acoustic sensor and to contacts of an external device interface of the housing.

The sensor signal processing circuit of the first implementation and its variations and combinations, wherein the control circuit is configured to allocate current elements to one or more segments active during corresponding sampling periods on a non-overlapped sliding basis, wherein current elements contributing to the feedback signal in the prior sampling period are not reallocated to the one or more segments active during the current sampling period until after all N current elements have contributed to the feedback signal.

The sensor signal processing circuit of the first implementation and its variations and combinations, wherein the acoustic sensor is a microelectromechanical systems (MEMS) sensor, and the external-device interface is a surface-mount interface disposed on a base portion of the housing.

While the disclosure and what is presently considered to be the best mode thereof has been described in a manner that establishes possession by the inventor and that enables those of ordinary skill in the art to make and use the same, it will be understood and appreciated that there are many equivalents to the embodiments disclosed herein and that myriad modifications and variations may be made thereto without departing from the scope and spirit of the invention, which are to be limited not by the exemplary embodiments but by the appended claims and their equivalents.

The invention claimed is:

1. A microphone assembly comprising:
a housing having a port and an external-device interface;
a sensor disposed in the housing and configured to generate an electrical signal in response to sensed environmental conditions;
an electrical circuit disposed in the housing and electrically coupled to contacts on the external-device interface,
the circuit comprising a delta-sigma analog-to-digital converter (ADC) configured to generate a multibit digital signal based on the electrical signal, the ADC comprising a digital-to-analog converter (DAC) including a plurality of N selectably enabled current elements in a feedback path of the ADC;
a control circuit coupled to the plurality of current elements and configured to adaptively activate one or more segments of current elements for a current sampling period based on a magnitude of a digital signal input to the DAC in a prior sampling period, wherein each active segment includes less than N current elements, each current element in the active segment is enabled and either contributes to a feedback signal of the DAC or does not contribute to the feedback signal, and current elements not in an active segment are disabled.

2. The microphone assembly of claim 1, wherein current elements contributing to the feedback signal in the prior sampling period are not reallocated to a segment active during a subsequent sampling period until after all or substantially all N current elements have contributed to the feedback signal.

3. The microphone assembly of claim 1, wherein the control circuit is configured to generate and buffer, during the prior sampling period, an enable signal for enabling current elements allocated to a segment active during the current sampling period.

4. The microphone assembly of claim 3, wherein the control circuit is configured to increase a number of segments active during the current sampling period in response to an overflow condition occurring in the prior sampling period and to modify the feedback signal of the current sampling period by a deviation value associated with the overflow condition.

5. The microphone assembly of claim 1, the control circuit is configured to allocate current elements to segments active during sequential sampling periods on a rotational basis, wherein current elements contributing to the feedback signal in the prior sampling period are not reallocated to a segment active during a subsequent sampling period until after all N current elements have been allocated to an active segment and contributed to the feedback signal.

6. The microphone assembly of claim 5 further comprising a data weighted averaging algorithm, wherein the control circuit is configured to reduce signal distortion by executing the data weighted averaging algorithm.

7. The microphone assembly of claim 1, wherein the sensor is an acoustic microelectromechanical systems (MEMS) sensor, and the external-device interface is a surface-mount interface disposed on a base of the housing.

8. A microphone signal processing circuit comprising:
  a multibit current mode delta-sigma analog-to-digital converter (ADC) having an analog input, the ADC configured to generate a digital signal based on an analog signal received from an electro-acoustic sensor,
  the ADC comprising a digital-to-analog converter (DAC) in a feedback path of the ADC, the DAC comprising N selectably enabled current elements; and
  a control circuit controllably coupled to the current elements and configured to adaptively activate one or more segments of current elements for a current sampling period based on a magnitude of a digital signal input to the DAC in a prior sampling period, wherein each active segment comprises a fixed number of current elements less than N, each current element in the active segment is enabled and either contributes to a feedback signal of the DAC or does not contribute to the feedback signal, and current elements not in an active segment are disabled.

9. The circuit of claim 8 further comprising an allocation algorithm, the control circuit configured to rotationally allocate current sources to the one or more segments active during the current sampling period upon execution of the allocation algorithm, wherein current elements contributing to the feedback signal in the prior sampling period are not reallocated to the one or more segments active during the current sampling period until after all or substantially all N current elements have contributed to the feedback signal.

10. The circuit of claim 8 further comprising a buffer, wherein the control circuit is configured to generate and store in the buffer, during the prior sampling period, an enable signal for enabling current elements allocated to the one or more segments active during the current sampling period.

11. The circuit of claim 8, wherein the control circuit is configured to increase a number of segments active during the current sampling period in response to an overflow condition occurring in the prior sampling period and to modify the feedback signal of the current sampling period by a deviation value associated with the overflow condition.

12. The circuit of claim 8 further comprising a non-overlapped sliding allocation algorithm executable by the control circuit, the control circuit is configured to rotationally and sequentially allocate current elements to one or more segments active during the current sampling period upon execution of the non-overlapped sliding allocation algorithm, wherein current elements contributing to the feedback signal in the prior sampling period are not reallocated to a segment active in the current sampling period until after all N current elements have contributed to the feedback signal.

13. The circuit of claim 11 further comprising a mismatch shaping algorithm executable by the control circuit, wherein the control circuit is configured to reduce signal distortion attributable to the DAC by executing the mismatch shaping algorithm.

14. The circuit of claim 8 in combination with an electro-acoustic sensor.

15. A method of processing an acoustic signal in an integrated circuit comprising a multibit current-mode Delta-sigma analog-to-digital converter (ADC) including a digital-to-analog converter (DAC) having N current elements, the method comprising:
  adaptively activating one or more segments of current elements for a current sampling period based on a digital signal input to the DAC in a prior sampling period by allocating less than N current elements to the active segment and enabling the allocated current elements,
  wherein current elements contributing to the feedback signal in the prior sampling period are not reallocated to the active segment and current elements not allocated to the active segment are not enabled;
  providing a feedback signal from an output of the DAC to an input of the ADC based on one or more of the enabled current elements of the active segment.

16. The method of claim 15, adaptively activating the segment by allocating current elements on a rotational basis, wherein current elements contributing to the feedback signal in the prior sampling period are not reallocated to segments active in the current sampling period until after all or substantially all N current elements have contributed to the feedback signal.

17. The method of claim 15, adaptively activating the segment by allocating current elements on a non-overlapped sliding basis, wherein current elements contributing to the feedback signal in the prior sampling period are not reallocated to segments active in a subsequent sampling period until after all current elements have contributed to the feedback signal.

18. The method of claim 15 further comprising generating and buffering, during the prior sampling period, an enable signal for activating current elements allocated to the one or more segments active during the current sampling period.

19. The method of claim 15 further comprising increasing a number of segments activated for the current sampling period in response to an overflow condition occurring in the prior sampling period, and modifying the feedback signal of the current sampling period by a deviation value associated with the overflow condition.

20. The method of claim 19 further comprising compensating for mismatch errors attributable to the DAC by executing a data weighted averaging algorithm.

* * * * *